Jan. 7, 1958  H. C. GOODRICH  2,819,442

ELECTRICAL CIRCUIT

Filed Nov. 29, 1954  2 Sheets-Sheet 1

INVENTOR.
HUNTER C GOODRICH
BY Morris Rabin
ATTORNEY

Jan. 7, 1958 H. C. GOODRICH 2,819,442

ELECTRICAL CIRCUIT

Filed Nov. 29, 1954 2 Sheets-Sheet 2

INVENTOR.
HUNTER C. GOODRICH
BY Morris Rabkin
ATTORNEY

United States Patent Office 2,819,442

Patented Jan. 7, 1958

2,819,442

ELECTRICAL CIRCUIT

Hunter C. Goodrich, Collingswood, N. J., assignor to Radio Corporation of America, a corporation of Delaware Application November 29, 1954, Serial No. 471,773

10 Claims. (Cl. 321—16)

This invention relates in general to electrical circuits, and more particularly to electrical circuits containing semiconductor devices. Although electrical circuits provided by the present invention are of general application, they are especially useful for the rectification and regulation of alternating voltages.

Semiconductor materials have been used in the past as detector crystals for demodulating a radio-frequency signal to produce the audio-frequency replica of the original modulation. These detector elements are ordinarily contact rectifiers in which a contact is made between a metallic point and the surface of a semiconductor material. Later techniques have provided the semiconductor junction. Semiconductor junctions may be formed at the boundary of two contiguous zones of semiconductor materials of opposite conductivity type. The two conductivity types have been conveniently designated as N type and P type. Consequently, the semiconductor junctions are known as P-N junctions. The materials which are predominantly used at present in semiconductor devices are germanium and silicon.

Rectification is a well known property of semiconductor devices having P-N junctions. Substantial conduction through the junction may take place only in one direction which is called the foward direction. Conduction in the opposite or reverse direction is ordinarily negligible. The forward direction is ordinarily defined as from the P zone into the N zone. Current may, therefore, only flow from the P zone into the N zone. Voltages that are applied to cause current flow in this direction are said to be applied in the forward direction. As a result of this property of rectification, a semiconductor device having a junction therein is, at times, called a semiconductor junction diode.

A certain phonomenon which is called the Zener effect has been observed to take place in the semiconductor junction. For a certain critical voltage or Zener voltage, which is impressed across the junction in the direction of reverse conduction, a sharply defined breakdown region may be encountered and heavy conduction may be then experienced in the reverse direction through the junction. This period of conduction persists as long as reverse voltages which are greater in magnitude than the Zener voltage are maintained.

This reverse conduction effect was originally attributed to a theory advanced by C. Zener in the "Proceedings of the Royal Society" (London), volume 145, page 523 which appeared in 1934. According to the Zener theory, field emission occurs at a critical magnitude of voltage which is applied in the direction of reverse conduction. The Zener effect in a semiconductor junction is discussed in an article by W. Shockley appearing in the "Proceedings of the I. R. E.," in volume 40, pages 1310 to 1311. This article was published in November, 1952. More recent studies have indicated that the Zener effect is more readily attributed to an avalanche breakdown of the type observed in gases. Two articles appearing in the "Physical Review" discuss this more recent theory in detail. A first article entitled "Electron multiplication in silicon and germanium" by K. G. McKay and K. B. McAffee appears in the "Physical Review," volume 91, No. 5 published on September 1, 1953, and discusses the experimental evidence for the avalanche breakdown theory. Another article entitled "Avalanche breakdown in silicon" by K. G. McKay which appears in the "Physical Review," volume 94, No. 4 on May 15, 1954 discusses the theoretical aspect for the avalanche breakdown theory. However, for purposes of the present application, and to conform to presently adopted terminology, the terms, Zener voltage, Zener breakdown and Zener current will be applied in connection with the reverse conduction phenomena in semiconductor junctions.

Many previous efforts to use semiconductor devices having junctions therein have been concerned with avoiding Zener breakdown. In some instances, a biasing potential is used to fix the zero line of the applied fundamental wave in such a position that the effective reverse or inverse potential applied across the junction is small so that Zener breakdown is not possible. Semiconductor diodes have also been constructed in a manner to increase the magnitude of the Zener breakdown voltage to values at which applied voltages will not cause breakdown in most applications. In accordance with the present invention, reverse conduction caused by the Zener effect is employed in an electrical circuit to obtain positive and negative clipping of a wave, to provide for rectification and regulation of alternating current voltage, and to accomplish wave shaping.

It is, therefore, an object of the present invention to utilize the properties of forward and reverse conduction in a semiconductor device.

It is another object of the present invention to provide an electrical circuit for rectification and voltage regulation which utilizes a semiconductor junction diode and the properties of reverse conduction and forward conduction therein.

It is a still further object of the present invention to provide a voltage regulating rectifier circuit which utilizes the Zener effect provided, for example, by a semiconductor junction diode.

It is a still further object of the present invention to provide an electrical circuit for rectifying alternating voltages and providing a direct current output voltage having a substantially constant magnitude.

It is a still further object of the present invention to provide apparatus for obtaining special waveforms.

These and still other objects of the present invention are accomplished according to an illustrative embodiment thereof comprising an electrical circuit in which a semiconductor junction diode is incorporated. This semiconductor junction diode is characterized by a moderate to heavy conductance in a forward direction, low conductance in a reverse direction and a sharply defined Zener breakdown voltage. As a consequence of the Zener breakdown effect, heavy conductance in a reverse direction at voltages having magnitudes larger than the Zener voltage are attainable. A capacitor for blocking the flow of direct current through the diode is connected in a series circuit with the diode. Connections across the series circuit are available for the application of voltages such as, for example, alternating voltages which are to be rectified. The greatest magnitude of the applied voltage is desirably larger than the Zener voltage of the diode.

It will be observed that conduction through the series circuit is possible in the forward direction and in the reverse direction when reverse voltages exceed the Zener voltage. The resistance of the diode is preferably negligible with respect to the remainder of the circuit during these periods of conduction. The applied voltage will appear across the diode. However, it will be clipped in the positive region and in the regions of negative polarities of the applied voltage which exceed the Zener voltage. Since the capacitor blocks the flow of direct current through the series circuit, the current through the capacitor and diode in the forward direction and in the reverse direction will be equal so that the average direct current is equal to zero. Equal voltage drops in the circuit accompanying these equal currents. The voltage across the diode will, therefore, be symmetrical in form. The average or direct-current voltage output is, then, constant for all applied voltages having a magnitude greater than magnitude of the Zener voltage. This voltage output is, consequently, regulated and is available for utilization. Furthermore, the input alternating wave is shaped so that it may be useful in pulse circuitry as a trigger signal.

Yet other objects and advantages of the present invention will, of course, become apparent and immediately suggest themselves to those skilled in the art to which the invention is directed from a reading of the following specification in connection with the accompanying drawings in which.

Figure 1:
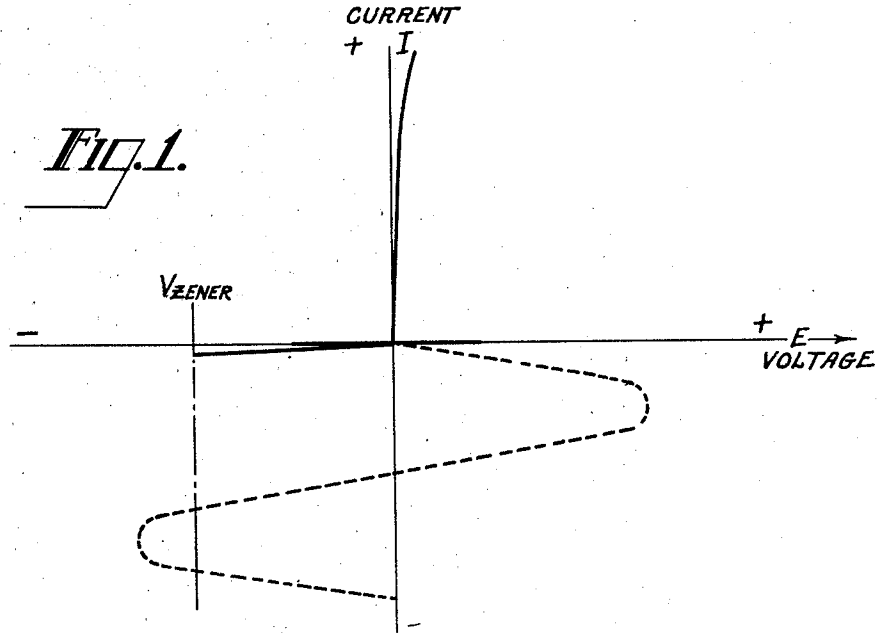
Figure 1 is a current-voltage characteristic of a semiconductor junction diode of the type incorporated in the present invention.

Referring to Figure 1, there is shown a current-voltage characteristic which may be obtained from a body of semiconductor material having a semiconductor junction therein formed at the boundary of two zones of semiconductor material of opposite conductivity types. This junction is conveniently called herein a P-N junction. The characteristic shown in Figure 1 is presently more readily obtained with silicon. Although the Zener breakdown occurs with germanium, more sharply defined breaks in the current-voltage characteristics may be observed in silicon junction diodes.

The forward current through the semiconductor diode for voltages polarized in the direction of forward conduction is shown in the first quadrant of the characteristic. When operating in this region of the characteristic the semiconductor diode exhibits low resistance or heavy forward conductance. For example, to obtain the characteristic in the first quadrant, voltages may be applied in the forward direction.

Reverse conduction characteristics are shown in Figure 1 in the third quadrant of the characteristic. These are obtained by the application of increasing negative potentials to the P zone of the semiconductive material. It is noted that very little current flows in the reverse direction at first. When the Zener voltage is applied, breakdown occurs, and a region of low resistance in the reverse direction follows.

A sinusoidal wave is shown by dotted lines on the current-voltage axes of Figure 1. This voltage alternates between positive and negative values. Were such a voltage applied across a semiconductor diode of the type described, conduction through the diode would take place throughout the positive cycle of the applied voltage and also during the period in which the negative voltage exceeds the Zener voltage.

Figure 2:
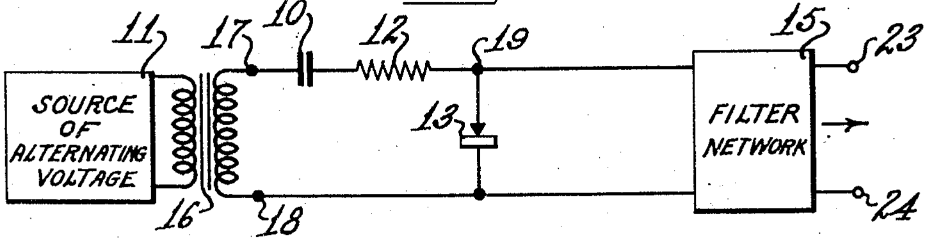
Figure 2 is a schematic circuit diagram of an illustrative embodiment of the present invention.

In Figure 2 an illustrative embodiment of an electrical circuit for utilizing the properties of a semiconductor junction diode having characteristics similar to those described in Figure 1 is shown. In this circuit, a source of alternating voltage 11, which may be a generator, an oscillator, or any other source of voltage having a waveform that alternates between positive and negative values, may be applied to the primary winding of a transformer 16. The secondary winding of the transformer 16 is connected between an input terminal 17 and a common terminal 18 such as ground. Direct current blocking means, such as a capacitor 10 is connected to the input terminal 17. A current limiting resistor 12 is connected between one end of the capacitor 10 and an output terminal 19 of the circuit. A semiconductor junction diode 13 of the type having a voltage current characteristic similar to the characteristic illustrated in Figure 1 is connected between the output terminal 19 and the common terminal 18. In the embodiment shown in Figure 2, a filter network 15 may be connected between the output terminal 19 and the common terminal 18 respectively. This filter network 15 may be a low pass filter of well known design, such as the type generally used to remove alternating current ripple from direct-current voltages. However, the output terminal 19 and the common terminal 18 may be connected directly to any loading circuit or other means for utilizing output voltages provided by the circuit. It is preferable, in any event, that the loading circuit connected between the output terminal 19 and the common terminal 18 has a value of resistance that is substantially greater than the value of the current-limiting resistor 12.

Figure 4:
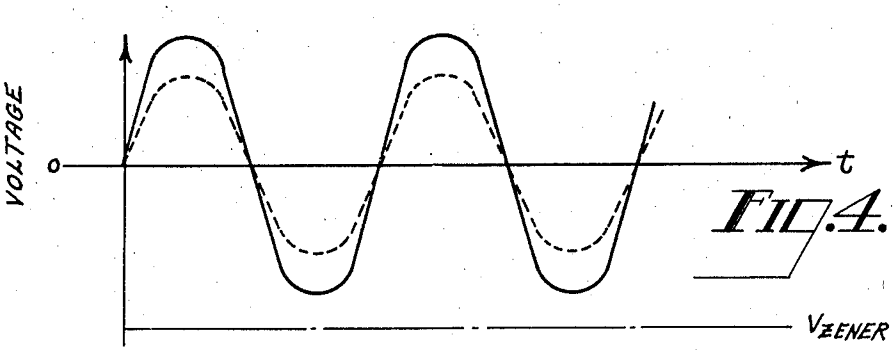
Figure 4 illustrates an input waveform such as may be applied to the illustrative electrical circuits shown herein which embody the present invention.

The operation of the circuit shown in Figure 2 will be best understood with reference to the waveform diagrams shown in Figures 4, 5, 6 and 7. It is assumed throughout these waveform diagrams that steady state operation of the circuit is taking place and that the period of transitory operation has passed. Figure 4 shows the sinusoidal voltage between the input terminal 17 and the common terminal 18. Two sinusoidal voltage waveforms are shown. The voltage having the greater magnitude is shown by the solid lines, and the voltage having a lower magnitude is shown by dotted lines. The magnitude of the Zener voltage is indicated on the voltage scale of Figure 4. It would appear, therefore, that conduction through the diode 19 would only take place in the forward direction and that no conduction would take place in the reverse direction because the Zener potential would never be attained. However, the capacitor 10 is connected in series with the diode 13. The capacitor 10 will, therefore, charge when the diode conducts in a forward direction so that the end of the capacitor 10 nearest to the input terminal assumes a positive polarity and the end of the capacitor 10 nearest the output terminal 19 assumes a negative polarity. The positive portion of the voltage across the diode 13 shown in Figure 5 may tend to be clamped at negative potentials. Since the peak-to-peak magnitude of the applied voltage is greater than the magnitude of the Zener voltage, conduction in the reverse direction takes place through the diode during the more negative portion of the voltage wave form. Conduction in the reverse direction when the applied voltage exceeds the Zener voltage is responsible for partially discharging of the capacitor 10. The voltage across the diode 13 will not be clamped to negative potentials at all times, but will attempt to go positive during each cycle. At those times, conduction takes place in a forward direction. This result and effect thereof are shown in the accompanying waveform diagrams.

Figures 5, 6, 7:
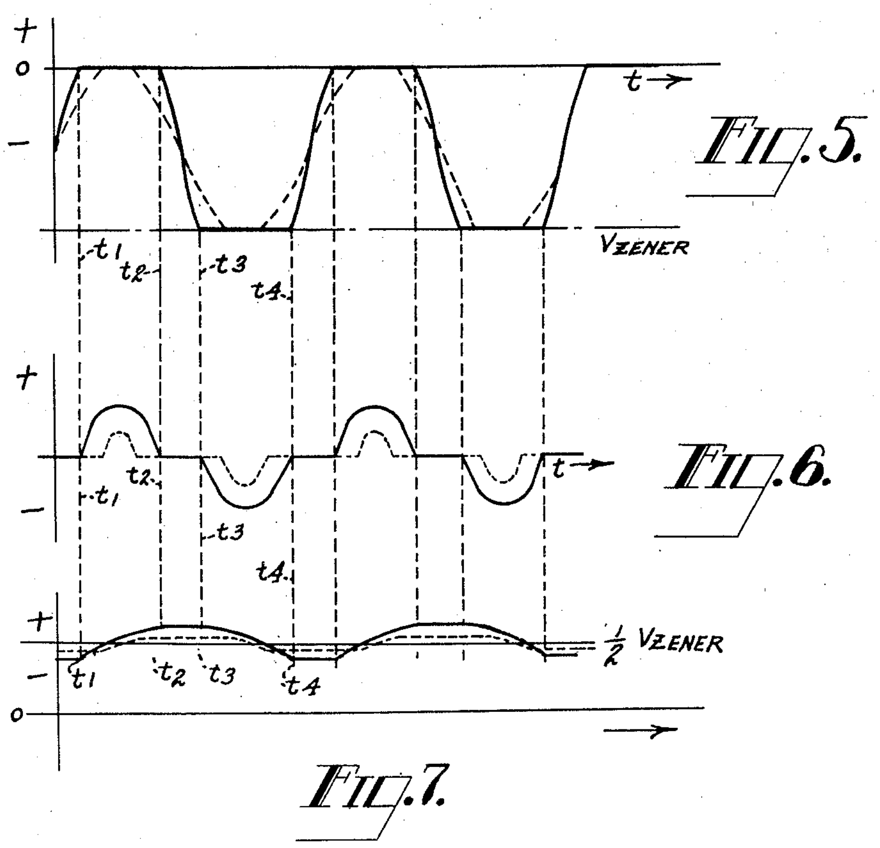
Figure 5 is a waveform diagram of the voltage across the diode in Figures 2 or 3.
Figure 6 is a waveform diagram of the current through the circuit shown in Figures 2 or 3.
Figure 7 is a waveform diagram of the voltage across the capacitor in the embodiment of the present invention illustrated in Figures 2 or 3.

The resistance exhibited by the diode 13 during conduction may be extremely low. The current-limiting resistor 12 has a value of resistance much higher than this low value of resistance exhibited by the diode 13 during conduction. Consequently, the majority of the voltage drop through the circuit during periods of conduction will appear across the current-limiting resistor 12. Figure 5 shows the effects of the aforementioned low resistance and high resistance regions of the diode 13 operating characteristics. Between the times $t_1$ and $t_2$ the diode is conducting in a forward direction. Therefore, clipping of the positive voltages that appear across the diode 13 occur. Clipping of the negative voltages which exceed the Zener voltage in magnitude occur between the times $t_3$ and $t_4$. It may be observed that the positive going and negative going portions of the waveform shown in Figure 5 are symmetrical. Equal portions of the applied waveform shown in Figure 4 appear to be clipped from the positive and negative ends of the waveform in Figure 5. The symmetrical form of the output voltage waveform across the diode is attributable to the operation of the capacitor 10.

It is known that the average value of direct current through a capacitor is zero. Since the current-voltage characteristic of the diode which is shown in Figure 1 is shaped substantially like an inverted Z, conduction of current through the diode 13 occurs at all values of positive potential and at values of negative potential which exceed the Zener potential. This produces a sinusoidal burst of current when the applied voltage across the diode 13 is positive. This burst of current is shown between the times $t_1$ and $t_2$ on Figure 6. Another burst of current in the negative direction occurs when the applied voltage across the diode 13 exceeds the Zener potential; that is between the times $t_3$ and $t_4$. The necessary condition that the average current through the capacitor must be equal to zero provides that the current waveform in a forward direction is symmetrical with the current waveform in the negative direction. Therefore, when the operation of the circuit is initiated, a transitory period takes place during which the positive and negative burst of current equalize and attain the waveform shown in Figure 6.

Referring to Figure 7, the waveform of the voltage across the capacitor is shown. Since an equal amount of current is gained and lost during the charging and discharging of the capacitor 10 respectively, the portions of the voltage waveform across the capacitor as shown in Figure 7 are in turn symmetrical. The alternating-current voltage waveform across the capacitor 10 is in the form of the integral of the current waveform shown in Figure 6. During the periods of conduction from times $t_1$ to $t_2$ and from times $t_3$ to $t_4$ the capacitor 10 charges and discharges, respectively. In the interval of non-conduction the charge is substantially maintained, consequently the voltage across the capacitor 10 remains constant. Subtracting the voltage drops across the capacitor 10 and the voltage limiting-resistor 12 during the charging and discharging periods of the capacitor, the symmetrical waveform shown in Figure 5 for the output voltage across the diode 13 results. Similar output waveforms occur during the next cycle and on succeeding cycles of the applied input voltage.

The dotted waveform shows that similar operation of the circuit of Figure 2 takes place as long as the peak-to-peak magnitude of the applied voltage exceeds the magnitude of the Zener voltage. Since the output voltage across the diode shown in Figure 5 is symmetrical in form and has a maximum amplitude equal to the Zener voltage, the average or direct-current component of this voltage is equal to one half the Zener voltage. Because the capacitor 10 blocks the passage of direct current therethrough, this direct-current voltage must appear across the terminals of the capacitor 10. Figure 7 shows that the average amplitude of the voltage across the capacitor is equal to one half the Zener voltage. It may also be observed that the variations or ripple in the voltage across the capacitor, as shown in Figure 7, are much less than the variations in voltage shown in Figure 5. It may, therefore, be desirable to use the output voltage across the capacitor 10. If a trapezoidal or square voltage waveform having a predetermined direct-current component is desired, the output voltage across the diode 13 is more useful. A substantially constant direct-current voltage may be obtained across the output terminals 23 and 24 of the filter network 15. For best operation of the present invention the input resistance of any circuit connected as a load should be substantially smaller than the total resistance in the series circuit containing the diode 13. In the event that a large, low resistance load is applied, the symmetry and constancy of the waveforms may be effected.

Figure 3:
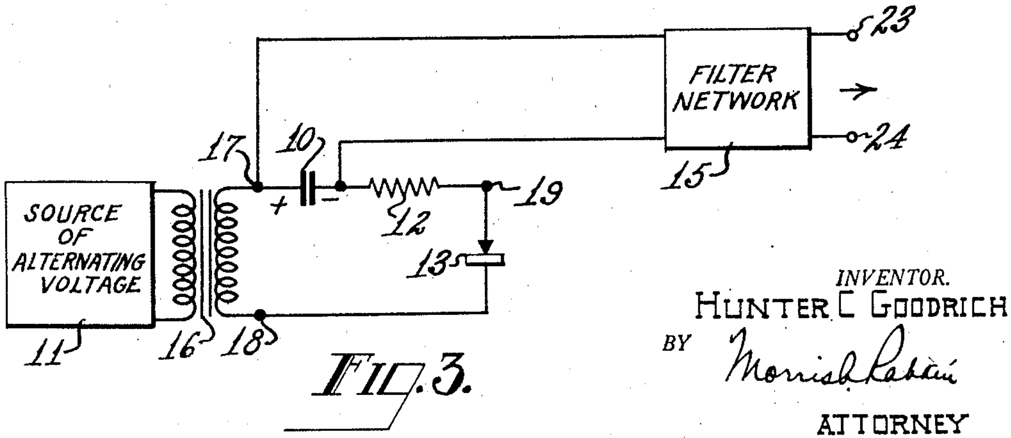
Figure 3 is a schematic circuit diagram similar to the circuit illustrated in Figure 1 in which output connections are obtained across a different element.

The circuit of Figure 3 is similar to the circuit of Figure 2 and like reference numerals are used to denote like parts. However, in this circuit the filter network 15 is connected across the capacitor 10 by connections between the input terminal 17 and the junction of the capacitor 10 and the current-limiting resistor 12. This arrangement may be preferable when it is desirable to obtain a more ripple-free voltage.

A silicon junction diode type No.1N138A may be used in the illustrative embodiments of the present invention shown in Figures 2 and 3. Maximum current and power dissipation limitations exist for silicon junction diodes for this type. Therefore, the current-limiting resistor 12 must be chosen in view of the amplitude of the applied voltage to limit maximum current and power dissipated in the diode 13. Solely by way of example, a value of 3,900 ohms for the current-limiting resistor 12 and a value of two microfarads for the capacitor 10 may be used in the embodiment of the present invention illustrated in Figures 2 and 3.

What is claimed is:

1. An electrical circuit comprising a rectifier having a voltage-current characteristic curve comprising two similarly inclined low resistance branches interconnected by a high-resistance branch, means for impressing an alternating signal voltage across said rectifier to cause said rectifier to operate said two low resistance branches of said curve, and means connected in the path of current through said rectifier for maintaining the average value of direct current through said rectifier substantially equal to zero.

2. A voltage-regulating rectifier circuit comprising an impedance element, said impedance element providing for conductance in a forward direction and a lesser degree of conductance in a reverse direction, said impedance element having a sharply defined low impedance breakdown region in said reverse direction, means for impressing an alternating voltage across said impedance element having a magnitude to cause said impedance element to operate in said low impedance breakdown region, and means for causing conducted current in said forward direction to be equal to conducted current in said reverse direction.

3. An electrical circuit comprising a rectifying element, said rectifying element comprising a body of semiconductive material having therein a zone of one conductivity type contigious with a zone of the opposite conductivity type forming a semiconductor junction therebetween, said rectifying element exhibiting substantial conductivity in a forward direction and a region of substantial conductivity in a reverse direction, said conductivity in said reverse direction occurring only with the application of voltages having magnitudes equal to and greater than a critical voltage, means for applying an alternating voltage having a magnitude greater than said critical voltage to said rectifying element, and means for maintaining current conducted through said rectifying element in said forward direction equal to current conducted through said rectifying element in said reverse direction.

4. An electrical network having an input, an output and a common terminal and comprising means for blocking the conduction of direct-current between said input and output terminals, a semiconductor junction diode connected between said output terminal and said common terminal, said diode having a Zener breakdown characteristic at inverse voltages having a magnitude greater than a critical magnitude, means for applying an alternating voltage having a magnitude greater than said critical magnitude between said input terminal and said common terminal, and means for obtaining an output voltage between any two of said terminals.

5. The electrical network, according to claim 4, wherein said output voltage has a direct-current magnitude equal to one half said critical magnitude.

6. An electrical circuit for rectifying a signal voltage and for maintaining the average value of a rectified output voltage substantially constant comprising a semiconductor junction diode having a current-voltage characteristic providing for a substantial current flow for voltages applied across said diode in a forward direction, substantially lower current flow in a reverse direction for voltages applied across said diode in a reverse direction and substantial current flow in said reverse direction at a predetermined magnitude of said applied reverse voltage, direct-current blocking means comprising a capacitor connected in series with said diode, and means for applying an alternating voltage to be rectified across said direct-current blocking means and said diode.

7. In combination with a semiconductor diode having a predetermined Zener breakdown voltage, a capacitor connected in a series circuit with said diode, a source of alternating voltage having a magnitude greater than the magnitude of the Zener voltage, means connecting said source of alternating voltage across said diode, a loading circuit, and means for connecting said loading circuit across said capacitor.

8. In combination with a semiconductor diode having a predetermined Zener breakdown voltage, a capacitor connected in a series circuit with said diode, a source of alternating voltage having a magnitude greater than the magnitude of said Zener voltage, means connecting said source of alternating voltage across said diode, a loading circuit, and means for connecting said loading circuit across said diode.

9. The combination with a semiconductor diode according to claim 7 in which said loading circuit includes a filter network.

10. The combination with a semiconductor diode according to claim 8 in which said loading circuit includes a filter network.

References Cited in the file of this patent

UNITED STATES PATENTS 2,742,601 Hyland ---------------- Apr. 17, 1956